United States Patent [19]

Kawagoe

[11] 3,946,251
[45] Mar. 23, 1976

[54] PULSE LEVEL CORRECTING CIRCUIT
[75] Inventor: Hiroto Kawagoe, Kodaira, Japan
[73] Assignee: Hitachi, Ltd., Japan
[22] Filed: Sept. 5, 1973
[21] Appl. No.: 394,456

[30] Foreign Application Priority Data
Oct. 4, 1972  Japan .................. 47-99016

[52] U.S. Cl. ........... 307/237; 307/264; 307/DIG. 1; 328/171
[51] Int. Cl.² ......................................... H03K 5/08
[58] Field of Search ........... 307/237, 251, 264, 304, 307/DIG. 1; 328/150, 165, 168, 169, 171, 172, 173; 330/144, 145

[56] References Cited
UNITED STATES PATENTS

| 3,117,287 | 1/1964 | Damico | 330/145 X |
| 3,205,458 | 9/1965 | Geery | 330/144 |
| 3,428,746 | 2/1969 | Graf | 328/169 X |
| 3,535,549 | 10/1970 | Herrero | 307/237 X |
| 3,588,525 | 6/1971 | Hatsukano | 307/251 X |
| 3,621,284 | 11/1971 | Cluett | 328/171 X |
| 3,636,385 | 1/1972 | Koepp | 307/237 X |
| 3,693,029 | 9/1972 | Niven, Jr. | 307/237 |
| 3,699,357 | 10/1972 | Lloyd | 328/151 X |
| 3,746,946 | 7/1973 | Clark | 307/251 X |
| 3,774,053 | 11/1973 | Carlson | 307/237 |

OTHER PUBLICATIONS
Buhler, "Clamp Circuit", IBM, Tech. Discl. Bull., Vol. 13, No. 8, p. 2251, 1/1971.

Primary Examiner—John S. Heyman
Assistant Examiner—L. N. Anagnos
Attorney, Agent, or Firm—Craig & Antonelli

[57] ABSTRACT

A pulse level correcting circuit wherein a resistance is interposed between the input and output sides, and a branch line including a switching element is disposed between an output terminal and a reference voltage terminal, the switching element being adapted to cause a current to flow through the resistance when the level of an input pulse is on the ground level side, whereby the level of the input pulse is corrected by the voltage drop across the resistance at the current flow.

7 Claims, 5 Drawing Figures

PULSE LEVEL CORRECTING CIRCUIT

BACKGROUND OF THE INVENTION

1. Field of the Invention

The present invention relates to pulse level correcting circuits, and more particularly to a pulse level correcting circuit which improves the level of a pulse signal on the ground side.

2. Description of the Prior Art

In using a semiconductor integrated circuit (IC), particularly a digital IC for an electronic calculator, an electronic timepiece, etc., the prescribed input level need be taken into consideration. At present, MOS (metal-oxide-semiconductor) IC's having such merits as high degree of integration and low power consumption are often employed in the uses of this field. Among the MOS IC's, the so-called silicon gate MOS IC in which polycrystal silicon is used for the gate electrode of a FET (field-effect transistor) has such merits as high-speed operation and low power consumption owing to its low threshold voltage characteristic, and it is recently in the limelight. On the other hand, however, the low threshold voltage characteristic has raised the problem of the norm of voltage levels on the ground potential side (high levels $V_{IH}$ in P-channel enhancement mode MOS transistors).

In more detail, the higher input level $V_{IH}$ need be confined below the threshold voltage (in absolute value) in order to prevent the transistor from operating erroneously. With lowering in the threshold voltage by the adoption of the silicon gate technique, it has become necessary to lower the higher input level $V_{IH}$. In particular, in a flip-flop, a shift register, a memory circuit, etc., employing transfer gate MOS FET's of the clock drive, when the higher level $V_{CPH}$ of a clock pulse exceeds the threshold voltage even slightly, the storage operation is greatly affected.

SUMMARY OF THE INVENTION

It is accordingly the principal object of the present invention to provide a circuit which corrects a pulse level on the ground level side.

Another object of the present invention is to provide a pulse level correcting circuit which can lighten conditions of the input level of an IC.

Still another object of the present invention is to provide a pulse level correcting circuit which can be easily put into the form of a semiconductor integrated circuit.

Yet another object of the present invention is to provide a pulse level correcting circuit which is suitable for a MOS type semiconductor integrated circuit.

In accordance with one aspect of the present invention, there is provided a pulse level correcting circuit which comprises a resistance interposed between the input and output of the circuit, and a branch line formed of a MOS FET and causing a current to flow through the resistance when the level of an input pulse is on the ground level side, the branch line being arranged between an output terminal and a ground terminal.

PREFERRED EMBODIMENT OF THE INVENTION

Figure 1:
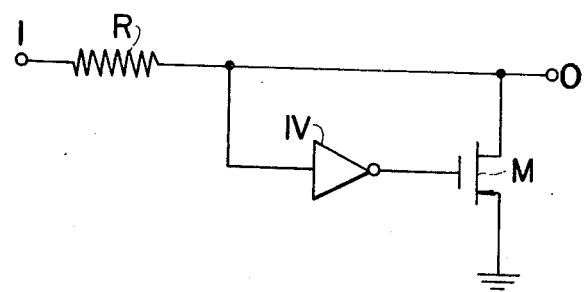
FIG. 1 is a schematic circuit diagram showing the pulse level correcting circuit according to the present invention.

Referring to the drawings, I designates an input terminal of the correcting circuit which is designed to receive a pulse input; while, O indicates an output terminal of the correcting circuit. By way of example, the correcting circuit is located at the input portion of a MOS type semiconductor integrated circuit. The input terminal I is connected to an input pin of the integrated circuit. To the output terminal O, there is connected a part of a circuit which satisfies the function of the integrated circuit. For example, a clock terminal may be connected to the input terminal I. The gate electrodes of transfer gate MOS FET's of a flip-flop circuit, a random access memory (RAM) or the like are connected to the output terminal O in a manner to be arranged in parallel. Further, the gate electrode of a load MOS FET is sometimes connected to the input terminal I.

A resistance R is interposed between the input terminal I and the output terminal O. When, in case of the MOS type semiconductor integrated circuit, a protective resistance (diffused resistance) for preventing the MOS FET gate from being destroyed due to external abnormal voltages is utilized as the resistance R, the number of circuit elements can be reduced very effectively.

A P-channel MOS FET device M is connected between the output terminal O and ground. The transistor M has an input pulse applied to its gate electrode through the resistance R and an inverter circuit IV.

Figure 4:
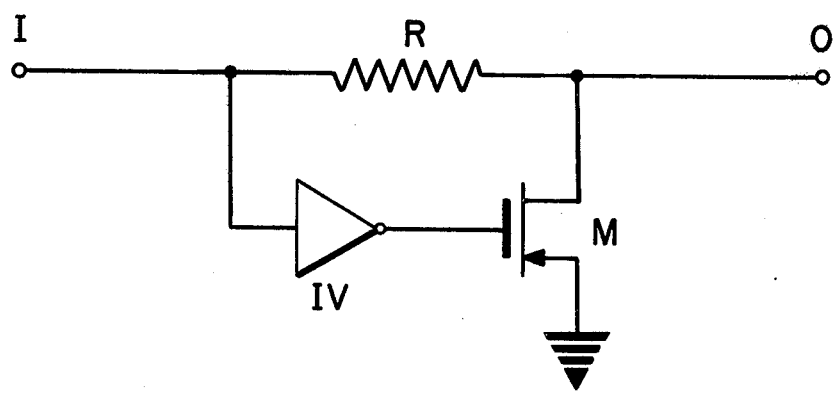

The inverter circuit IV may also be connected between the input terminal I and the gate electrode of the FET device M, as shown in FIG. 4. However, in the case where a MOS FET is used to form the inverter circuit, in order to prevent gate destruction thereof, it is preferable to connect the inverter circuit through the resistance R to the input terminal, as shown in the drawing.

Figure 2:
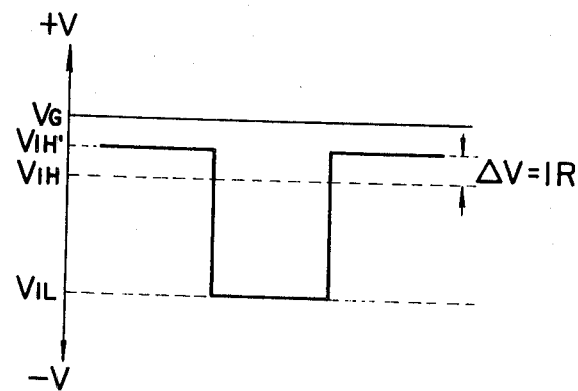
FIG. 2 is a waveform diagram showing the output voltages of the circuit in FIG. 1.

Description will now be made of the pulse level correcting circuit constructed as described above. First, in the case where the level of the input pulse is on the negative side of a power source level $V_{IG}$, namely, at a lower level $V_{IL}$, as seen in FIG. 2, a voltage of a level resulting from the inversion of the input level by the inverter IV or a voltage of a higher level (a level on the ground side) is applied to the gate electrode of the FET device M, and hence, the FET device M is non-conductive Accordingly, the lower input level $V_{IL}$ appears at the output terminal O as it is, because it is hardly affected by the FET device M.

Next, when the level of the input pulse changes to the ground level side, namely, to the higher level $V_{IH}$, a voltage of the lower level is applied to the gate electrode of the FET device M by the inverter IV, and hence, the FET device M becomes conductive. In consequence, a branch line is established by the FET device M, and a current flows through the resistance R via the branch line. On account of a voltage drop $\Delta V$ across the resistance R at this time, the higher input level $V_{IH}$ is made smaller (in absolute value) to a value $V_{IH}{}' \ (= V_{IH} - \Delta V)$, as shown in FIG. 2. The reduced level $V_{IH}{}'$ appears at the output terminal O.

The higher input level as corrected in this manner $V_{IH}'$ is represented as below, letting $R_{ON}$ be the source-drain resistance of the FET M at its conduction.

$$V_{IH}' = \frac{R_{ON}}{R + R_{ON}} \cdot V_{IH}$$

When the pulse level correcting circuit thus constructed is connected to the input portion of the semiconductor integrated circuit, the higher input level is made smaller by the correcting circuit, and the corrected level signal is fed to the succeeding stage of the circuit. Restrictions to the level of the input signal of the semiconductor integrated circuit can therefore be lightened. It will be apparent from the above description that the pulse level correcting circuit is remarkably effective particularly when added to the gates of transfer gate MOS FET's of a memory circuit, etc.

The level correcting circuit according to the present invention can be constructed integrally with the semiconductor integrated circuit portion at the front stage portion, and can thus deliver a signal with the output level on the ground side lowered. It can also be constructed integrally with a semiconductor integrated circuit portion at the rear stage portion, and can thus operate the semiconductor integrated circuit at the rear stage portion, in such a manner that an input signal whose level on the ground side is higher has that level lowered.

In such cases, the inverter and FET device M in the level correcting circuit may be produced by the same process as that of the semiconductor integrated circuit portion at the front or rear stages, to make all the threshold voltages of the transistors substantially equal. In this case, the $g_m$ characteristic, etc., of the inverter may be designed so that, even when the ground side level somewhat exceeding the threshold voltage of the inverter IV is applied to the inverter and causes the inverter to provide an output, the gate voltage of the FET device M may be prevented from becoming less than the threshold voltage due to the output.

Moreover, the pulse level correcting circuit can be singly manufactured as a buffer circuit for grounding a semiconductor integrated circuit or another circuit and a semiconductor integrated circuit, and can thus connect both the circuits. It will be understood that, in this case, the correcting circuit has wide application.

In more detail, in the case of connecting integrated circuits, the incorporation of an inverter of high threshold voltage into the connecting portion is considered in order to avoid the influences of noise. With this measure, however, the phase is inverted. In contrast, when the inverter is applied as in the present invention, the input and output are in-phase.

Although, in the above, the present invention has been explained in connection with its preferred embodiment, it can adopt a variety of modified means without being restricted thereto.

Figure 5:
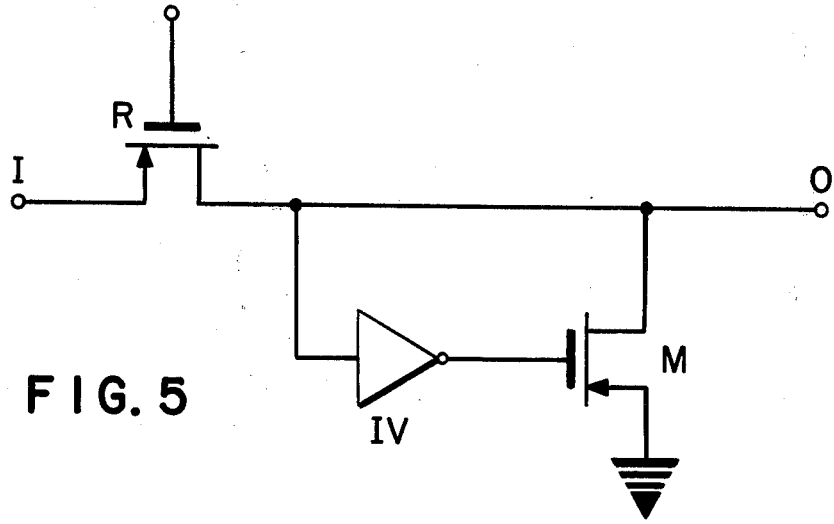

For example, the resistance R may be replaced with another impedance element. As a specific example, the channel resistance of a MOS FET may be utilized, as shown in FIG. 5. In this case, the source and drain electrodes of the MOS FET are connected to the input and output terminals of the correction circuit, while a DC voltage is applied to the gate electrode. In place of the P-channel MOS FET, there can be employed not only an N-channel MOS FET but also another switching element such as a bipolar transistor.

Figure 3:
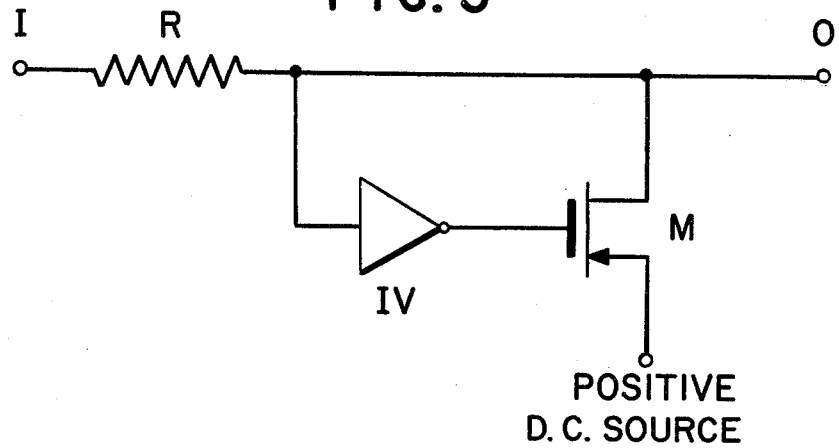
FIGS. 3 through 5 are schematic circuit diagrams of other embodiments of the present invention.

Further, in place of grounding the source electrode of the FET device M, a positive supply voltage may be impressed on the electrode, as shown in FIG. 3. In this case, the level of the input pulse can also be corrected with the supply voltage.

What is claimed is:

1. A pulse level correcting circuit comprising an input and an output terminal, pulse signal means connected to said input terminal for supplying thereto a pulse signal having a first and a second voltage level, impedance means interposed between said input terminal and output terminal of said correcting circuit for transferring said pulse signal to said output terminal so that the output signal has the two voltage levels which are substantially the same as said first and second voltage levels, and a branch line including switching means for causing a current to flow through said impedance means when the level of the input pulse signal applied to said input terminal corresponds to said first level, said branch line being arranged between one side of said impedance means and a reference voltage terminal the voltage of which is substantially the same as said first voltage level, whereby the level of said input pulse is improved by the voltage drop across said impedance element during current flow, wherein said branch line further includes an inverter connected between one of the terminals of said impedance means and an input electrode of said switching means, and wherein said switching means comprises a MOS FET device having its gate electrode connected to the output of said inverter, its drain electrode directly connected to said output terminal and its source electrode directly connected to said reference voltage terminal.

2. A pulse level correcting circuit as defined in claim 1, wherein the source electrode of said MOS FET is connected to ground.

3. A pulse level correcting circuit as defined in claim 1, wherein the source electrode of said MOS FET is connected to a positive D.C. source.

4. A pulse level correcting circuit as defined in claim 1, wherein the input of said inverter is connected to said output terminal.

5. A pulse level correcting circuit as defined in claim 1, wherein the input of said inverter is connected to said input terminal.

6. A pulse level correcting circuit as defined in claim 1, wherein said impedance means is a resistor.

7. A pulse level correcting circuit as defined in claim 1, wherein said impedance means is a MOS FET having its gate connected to a D.C. source.

* * * * *